(12) United States Patent
Sumeet et al.

(10) Patent No.: US 11,669,314 B2
(45) Date of Patent: Jun. 6, 2023

(54) METHOD AND SYSTEM TO ENABLE PRINT FUNCTIONALITY IN HIGH-LEVEL SYNTHESIS (HLS) DESIGN PLATFORMS

(71) Applicant: Tata Consultancy Services Limited, Mumbai (IN)

(72) Inventors: Nupur Sumeet, Thane West (IN); Manoj Nambiar, Thane West (IN)

(73) Assignee: TATA CONSULTANCY SERVICES LIMITED, Mumbai (IN)

( * ) Notice: Subject to any disclaimer, the term of this patent is extended or adjusted under 35 U.S.C. 154(b) by 0 days.

(21) Appl. No.: 17/562,378

(22) Filed: Dec. 27, 2021

(65) Prior Publication Data
US 2022/0350580 A1 Nov. 3, 2022

(30) Foreign Application Priority Data
Mar. 30, 2021 (IN) .............................. 202121014186

(51) Int. Cl.
*G06F 8/51* (2018.01)
*G06F 8/10* (2018.01)
(Continued)

(52) U.S. Cl.
CPC ................. *G06F 8/51* (2013.01); *G06F 8/10* (2013.01); *G06F 8/315* (2013.01); *G06F 8/458* (2013.01); *G06F 30/327* (2020.01)

(58) Field of Classification Search
None
See application file for complete search history.

(56) References Cited

U.S. PATENT DOCUMENTS 5,854,929 A * 12/1998 Van Praet ................. G06F 8/41
712/226
6,226,776 B1 * 5/2001 Panchul .................. G06F 30/30
716/102
(Continued)

FOREIGN PATENT DOCUMENTS

EP 3859531 A1 * 8/2021 ............ G06F 11/364
EP 3859531 B1 * 9/2022 ............ G06F 11/364

OTHER PUBLICATIONS

Muslim, Fahad Bin, et al. "Efficient FPGA implementation of OpenCL high-performance computing applications via high-level synthesis." IEEE Access 5 (2017): 2747-2762. (Year: 2017).*

(Continued)

*Primary Examiner* — Matthew J Brophy
(74) *Attorney, Agent, or Firm* — Finnegan, Henderson, Farabow, Garrett & Dunner, LLP

(57) ABSTRACT

This disclosure generally relates to high-level synthesis (HLS) platforms, and, more particularly, enable print functionality in high-level synthesis (HLS) platforms. The recent availability FPGA-HLS is a great success due to availability of compilers for FPGAs as opposed to hardware description languages (HDLs) that requires special skills. However, the compilers within the HLS design platform includes limited support for all the standard libraries, wherein features like print functionality is not supported. The invention discloses techniques to enable print functionality in HLS design platforms based on source-to-source transformations and stream combining scheme. In addition to enabling print functionality, the invention also discloses a formatter technique to receive-format FPGA data into human interpretable data.

13 Claims, 10 Drawing Sheets

(51) Int. Cl.
*G06F 8/30* (2018.01)
*G06F 8/41* (2018.01)
*G06F 30/327* (2020.01)

(56) References Cited

U.S. PATENT DOCUMENTS

| | | | | |
|---|---|---|---|---|
| 7,475,000 | B2* | 1/2009 | Cook | G06F 30/30 |
| | | | | 716/101 |
| 8,881,079 | B1* | 11/2014 | Pan | G06F 30/3312 |
| | | | | 716/111 |
| 9,329,843 | B2* | 5/2016 | Cheng | G06F 8/41 |
| 9,576,092 | B2* | 2/2017 | Platzker | G06F 30/327 |
| 9,626,165 | B1* | 4/2017 | Ni | G06F 30/34 |
| 9,690,894 | B1* | 6/2017 | Titley | G06F 30/34 |
| 9,710,584 | B1* | 7/2017 | Hao | G06F 30/327 |
| 9,817,929 | B1* | 11/2017 | Chauhan | G06F 30/3323 |
| 9,824,172 | B1* | 11/2017 | Hao | G06F 30/327 |
| 10,007,748 | B2* | 6/2018 | Titley | G06F 30/327 |
| 10,169,513 | B2* | 1/2019 | Huang | G06F 30/34 |
| 10,366,190 | B2* | 7/2019 | Titley | G06F 30/327 |
| 10,515,168 | B1* | 12/2019 | Chauhan | G06F 30/30 |
| 10,545,739 | B2* | 1/2020 | Cho | G06F 8/40 |
| 11,366,662 | B2* | 6/2022 | Tanuma | G06F 9/3824 |
| 2002/0072893 | A1* | 6/2002 | Wilson | G06F 13/1605 |
| | | | | 714/E11.207 |
| 2007/0028204 | A1* | 2/2007 | Takeda | G06F 30/3323 |
| | | | | 716/103 |
| 2017/0293703 | A1* | 10/2017 | Titley | G06F 30/34 |
| 2017/0323045 | A1* | 11/2017 | Huang | G06F 30/34 |
| 2018/0218094 | A1* | 8/2018 | Titley | G06F 30/34 |
| 2021/0232486 | A1* | 7/2021 | Barve | G06F 13/28 |
| 2021/0311732 | A1* | 10/2021 | Tanuma | G06F 9/3001 |

OTHER PUBLICATIONS

Goeders, Jeffrey, and Steven JE Wilton. "Signal-tracing techniques for in-system FPGA debugging of high-level synthesis circuits." IEEE Transactions on Computer-Aided Design of Integrated Circuits and Systems 36.1 (2016): 83-96. (Year: 2016).*

Jacobsen, Matthew, et al. "RIFFA 2.1: A reusable integration framework for FPGA accelerators." ACM Transactions on Reconfigurable Technology and Systems (TRETS) 8.4 (2015): 1-23. (Year: 2015).*

Calagar, Nazanin, Stephen D. Brown, and Jason H. Anderson. "Source-level debugging for FPGA high-level synthesis." 2014 24th international conference on field programmable logic and applications (FPL). IEEE, 2014. (Year: 2014).*

Xillybus 2020 Xillybus FPGA Designer's Guide. Available at <http://www.xillybus.com/downloads/doc/xillybus_fpga_api.pdf> (Year: 2020).*

Jamal, Al-Shahna, et al. "Fast Turnaround HLS Debugging using Dependency Analysis and Debug Overlays." ACM Transactions on Reconfigurable Technology and Systems (TRETS) 13.1 (2020): 1-26. (Year: 2020).*

Parnassos, Ioannis, et al. "SoCLog: A real-time, automatically generated logging and profiling mechanism for FPGA-based Systems On Chip." 2016 26th International Conference on Field Programmable Logic and Applications (FPL). IEEE, 2016. (Year: 2016).*

Canis, Andrew, et al. "LegUp: An open-source high-level synthesis tool for FPGA-based processor/accelerator systems." ACM Transactions on Embedded Computing Systems (TECS) 13.2 (2013): 1-27. (Year: 2013).*

Monson, Joshua S., and Brad Hutchings. "Using source-to-source compilation to instrument circuits for debug with high level synthesis." 2015 International Conference on Field Programmable Technology (FPT). IEEE, 2015. (Year: 2015).*

Chi et al., "Extending High-Level Synthesis for Task-Parallel Programs," (2020).

Choi et al., "HLS-Based Optimization and Design Space Exploration for Applications with Variable Loop Bounds," (2018).

Parnassos et al., "SoCLog: A Real-Time, Automatically Generated Logging and Profiling Mechanism for FPGA-based Systems on Chip," (2016).

* cited by examiner

```
 1  void func_foo() {
 2    int A=3,B=6,C=7,i=0;
 3    printf("Val A is %d",A);
 4    A=B+C;
 5    printf("Change1:A %d",A);
 6    A=2*A;
 7    printf("Change2:A %d",A);
 8    while(i<10) {
 9      C=C++; i++;
10      printf("Val C %d",C);
11    }
12  }
```

FIG. 4A

```
void func_foo() {
  int A=3,B=6,C=7,i=0;
  HLS_PRINT --var A --typ int --com Val A
  A=B+C;
  HLS_PRINT --var A --typ int --com Change1:A
  A=2*A;
  HLS_PRINT --var A --typ int --com Change2:A
  while(i<10) {
    C=C++; i++;
    HLS_PRINT --var C --typ int --com Val C
  }
}
```

FIG. 4B

```
void func_foo(stream <int> prt_stm_A,
              stream <int> prt_stm_C) {
  int A=3,B=6,C=7,i=0;
  prt_stm_A.write(A);
  A=B+C;
  prt_stm_A.write(A);
  A=2*A;
  prt_stm_A.write(A);
  while(i<10) {
    C=C++; i++;
    prt_stm_C.write(C);
  }
}
```

FIG. 4C

METHOD AND SYSTEM TO ENABLE PRINT FUNCTIONALITY IN HIGH-LEVEL SYNTHESIS (HLS) DESIGN PLATFORMS

PRIORITY CLAIM

This U.S. patent application claims priority under 35 U.S.C. § 119 to: India Application No. 202121014186, filed on 30 Mar. 2021. The entire contents of the aforementioned application are incorporated herein by reference.

TECHNICAL FIELD

The disclosure herein generally relates to high-level synthesis (HLS) design platforms, and, more particularly, enable print functionality in high-level synthesis (HLS) development and design platforms.

BACKGROUND

Field programmable gate array (FPGAs) have grown computationally powerful over time and are increasingly utilized for implementing low latency transaction processing systems. The recent availability of High-Level Synthesis (HLS) design platforms for FPGA has further simplified hardware design development to a great extent. The important factor for the success of FPGA-HLS is the availability of compilers for FPGAs as opposed to hardware description languages (HDLs) that requires special programming skills. The HLS design platform includes a compiler for compiling a high-level language (such as C/C++) into a corresponding HDL (Hardware Description Language) representation, thus making it easy for coding without the requirement of expertise in HDL.

However, the compilers within the HLS design platform includes limited support for all the standard libraries that accompany these languages. Considering an example scenario of the data center operations, several data such as run time contextual data, intermediate steps and final results are logged, wherein the logged data is utilized for auditing, data for machine learning or just troubleshooting application execution issues. However, the current HLS design platform do not support the necessity functionality of printing the logged data. The current state of art techniques uses hardware vendor specific tools such as integrated logic analyzers (ILA) for collecting logging data. However the ILA has several challenges such as Manual integration in the HDL representation that is tedious and calls for automation, requires knowledge of HDL, the ILAs have an associated buffer which has an upper limit on amount of data that can be captured, which is far too less for production environment

SUMMARY

Embodiments of the present disclosure present technological improvements as solutions to one or more of the above-mentioned technical problems recognized by the inventors in conventional systems. For example, in one embodiment, a method for method and system to enable print functionality in high-level synthesis (HLS) design platforms is provided. The method includes receiving a source code associated with an IT application at a High-Level Synthesis (HLS) platform wherein the source code comprises at least a print statement with a set of print variables to be printed, the source code is associated with a source code operation frequency and the IT application utilizes a Field Programmable Gate Array (FPGA) as a processing platform that is associated with a peripheral component interconnect express (PCIe) bandwidth threshold limit. The method further includes receiving a plurality of low level integration inputs at the HLS platform wherein the low level integration inputs are associated with the FPGA and comprises a cycle counter, an application counter and a stream ID generator. The method further includes updating the source code to obtain a print version of the source code by including a set of HLS print statements. The method further includes pre-processing the print version of the source code to obtain a synthesizable source code using a source-to-source transformations based on a code generation script. The method further includes synthesizing the synthesizable source code to obtain an HLS_IP (HLS_Intellectual Property) based on the source code operation frequency. The method further includes determining if the HLS_IP is within the PCIe bandwidth threshold limit, based on the determination creating a plurality of print records in HLS_IP using the plurality of low level integration input, wherein a print record is created for every print variable from the set of print variables. The method further includes connecting the plurality of print records to a plurality of First in First out (FIFO) units, wherein each print record from the plurality of print records is connected to a FIFO unit from amongst the plurality of First in First out (FIFO) units. The method further includes combining the plurality of print records to obtain a valid sequential print record, wherein the combining includes scanning the plurality of print records using a stream combining scheme based on round robin technique. The method further includes synthesizing a Hardware Development Language (HDL) design using the HLS_IP, the plurality of print records and the valid sequential print record and creating an executable bitstream of the HDL design. The method further includes sharing the executable bitstream with an FPGA for processing. The method further includes receiving the processed sequential print records from the FPGA over a PCIe at a host, wherein the processed sequential print records is in a binary format. The method further includes converting the processed sequential print records to a human interpretable data in the host using a formatter technique and printing the human interpretable data.

In another aspect, a system for method and system to enable print functionality in high-level synthesis (HLS) design platforms is provided. The system includes a memory storing instructions, one or more communication interfaces; and one or more hardware processors coupled to the memory via the one or more communication interfaces, wherein the one or more hardware processors are configured by the instructions for receiving a source code associated with an IT application at a High-Level Synthesis (HLS) platform wherein the source code comprises at least a print statement with a set of print variables to be printed, the source code is associated with a source code operation frequency and the IT application utilizes a Field Programmable Gate Array (FPGA) as a processing platform that is associated with a peripheral component interconnect express (PCIe) bandwidth threshold limit. The one or more hardware processors are further configured by the instructions for includes receiving a plurality of low level integration inputs at the HLS platform, wherein the low level integration inputs are associated with the FPGA and comprises a cycle counter, an application counter and a stream ID generator. The one or more hardware processors are further configured by the instructions for updating the source code to obtain a print version of the source code by including a set of HLS print statements. The one or more hardware processors are further configured by the instructions for pre-processing the print version of the source code to obtain a synthesizable source code using a source-to-source transformations based on a code generation script. The one or more hardware processors are further configured by the instructions for synthesizing the synthesizable source code to obtain an HLS_IP (HLS_Intellectual Property) based on the source code operation frequency. The one or more hardware processors are further configured by the instructions for determining if the HLS_IP is within the PCIe bandwidth threshold limit, based on the determination creating a plurality of print records in HLS_IP using the plurality of low level integration input, wherein a print record is created for every print variable from the set of print variables. The one or more hardware processors are further configured by the instructions for connecting the plurality of print records to a plurality of First in First out (FIFO) units, wherein each print record from the plurality of print records is connected to a FIFO unit from amongst the plurality of First in First out (FIFO) units. The one or more hardware processors are further configured by the instructions for combining the plurality of print records to obtain a valid sequential print record, wherein the combining includes scanning the plurality of print records using a stream combining scheme based on round robin technique The one or more hardware processors are further configured by the instructions for synthesizing a Hardware Development Language (HDL) design using the HLS_IP, the plurality of print records and the valid sequential print record and creating an executable bitstream of the HDL design. The one or more hardware processors are further configured by the instructions for sharing the executable bitstream with an FPGA for processing. The one or more hardware processors are further configured by the instructions for receiving the processed sequential print records from the FPGA over a PCIe at a host, wherein the processed sequential print records is in a binary format. The one or more hardware processors are further configured by the instructions for converting the processed sequential print records to a human interpretable data in the host using a formatter technique and printing the human interpretable data.

In yet another aspect, a non-transitory computer readable medium for method and system to enable print functionality in high-level synthesis (HLS) design platforms is provided. The program includes receiving a source code associated with an IT application at a High-Level Synthesis (HLS) platform wherein the source code comprises at least a print statement with a set of print variables to be printed, the source code is associated with a source code operation frequency and the IT application utilizes a Field Programmable Gate Array (FPGA) as a processing platform that is associated with a peripheral component interconnect express (PCIe) bandwidth threshold limit. The program further includes receiving a plurality of low level integration inputs at the HLS platform wherein the low level integration inputs are associated with the FPGA and comprises a cycle counter, an application counter and a stream ID generator. The program further includes updating the source code to obtain a print version of the source code by including a set of HLS print statements. The program further includes pre-processing the print version of the source code to obtain a synthesizable source code using a source-to-source transformations based on a code generation script. The program further includes synthesizing the synthesizable source code to obtain an HLS_IP (HLS_Intellectual Property) based on the source code operation frequency. The program further includes determining if the HLS_IP is within the PCIe bandwidth threshold limit, based on the determination creating a plurality of print records in HLS_IP using the plurality of low level integration input, wherein a print record is created for every print variable from the set of print variables. The program further includes connecting the plurality of print records to a plurality of First in First out (FIFO) units, wherein each print record from the plurality of print records is connected to a FIFO unit from amongst the plurality of First in First out (FIFO) units. The program further includes combining the plurality of print records to obtain a valid sequential print record, wherein the combining includes scanning the plurality of print records using a stream combining scheme based on round robin technique. The program further includes synthesizing a Hardware Development Language (HDL) design using the HLS_IP, the plurality of print records and the valid sequential print record and creating an executable bitstream of the HDL design. The program further includes sharing the executable bitstream with an FPGA for processing. The program further includes receiving the processed sequential print records from the FPGA over a PCIe at a host, wherein the processed sequential print records is in a binary format. The program further includes converting the processed sequential print records to a human interpretable data in the host using a formatter technique and printing the human interpretable data.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles:

FIGS. 4A, 4B and 4C is a diagram illustrating a source code associated with an IT application, a print version of the source code and a synthesizable source code of the source code in accordance with some embodiments of the present disclosure.

DETAILED DESCRIPTION

Figure 1:
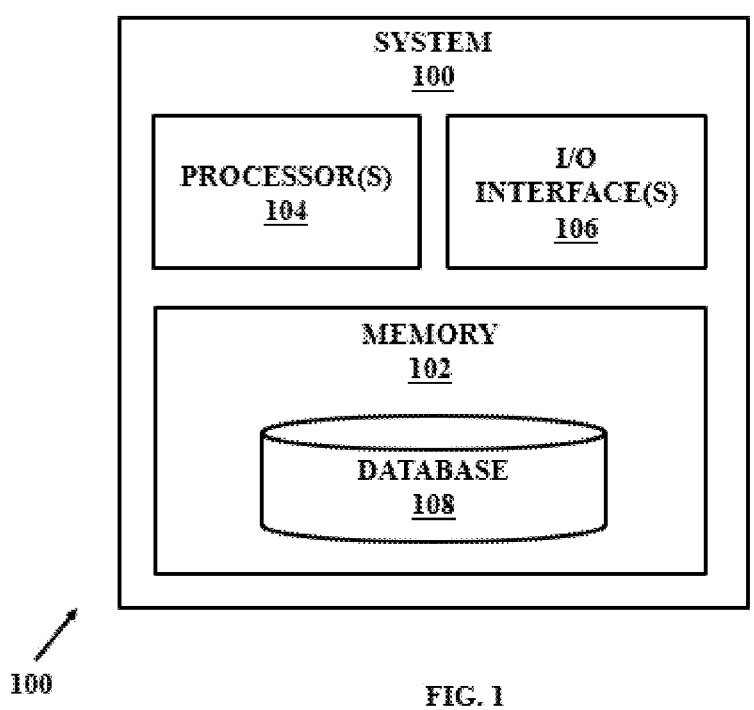
FIG. 1 illustrates an exemplary system to enable print functionality in high-level synthesis (HLS) design platforms according to some embodiments of the present disclosure.

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments.

Referring now to the drawings, and more particularly to FIG. 1 through FIG. 8 where similar reference characters denote corresponding features consistently throughout the figures, there are shown preferred embodiments and these embodiments are described in the context of the following exemplary system and/or method.

FIG. 1 is a functional block diagram of a system 100 for method and system to enable print functionality in high-level synthesis (HLS) design platforms in accordance with some embodiments of the present disclosure.

In an embodiment, the system 100 includes a processor(s) 104, communication interface device(s), alternatively referred as input/output (I/O) interface(s) 106, and one or more data storage devices or a memory 102 operatively coupled to the processor(s) 104. The system 100 with one or more hardware processors is configured to execute functions of one or more functional blocks of the system 100.

Referring to the components of system 100, in an embodiment, the processor(s) 104, can be one or more hardware processors 104. In an embodiment, the one or more hardware processors 104 can be implemented as one or more microprocessors, microcomputers, microcontrollers, digital signal processors, central processing units, state machines, logic circuitries, and/or any devices that manipulate signals based on operational instructions. Among other capabilities, the one or more hardware processors 104 is configured to fetch and execute computer-readable instructions stored in the memory 102. In an embodiment, the system 100 can be implemented in a variety of computing systems including laptop computers, notebooks, hand-held devices such as mobile phones, workstations, mainframe computers, servers, a network cloud and the like.

The I/O interface(s) 106 can include a variety of software and hardware interfaces, for example, a web interface, a graphical user interface, a touch user interface (TUI) and the like and can facilitate multiple communications within a wide variety of networks N/W and protocol types, including wired networks, for example, LAN, cable, etc., and wireless networks, such as WLAN, cellular, or satellite. In an embodiment, the I/O interface (s) 106 can include one or more ports for connecting a number of devices (nodes) of the system 100 to one another or to another server.

The memory 102 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes.

Further, the memory 102 may include a database 108, which may store data related to historical electricity parameters like a historic demand, a historic price, a historic clearing price and a historic clearing quantity and like. Thus, the memory 102 may comprise information pertaining to input(s)/output(s) of each step performed by the processor(s) 104 of the system 100 and methods of the present disclosure. In an embodiment, the database 108 may be external (not shown) to the system 100 and coupled to the system via the I/O interface 106. Functions of the components of system 100 are explained in conjunction with functional overview of the system 100 in FIG. 2 and flow diagram of FIGS. 3A and 3B for method and system to enable print functionality in high-level synthesis (HLS) design platforms.

The system 100 supports various connectivity options such as BLUETOOTH®, USB, ZigBee and other cellular services. The network environment enables connection of various components of the system 100 using any communication link including Internet, WAN, MAN, and so on. In an exemplary embodiment, the system 100 is implemented to operate as a stand-alone device. In another embodiment, the system 100 may be implemented to work as a loosely coupled device to a smart computing environment. The components and functionalities of the system 100 are described further in detail.

Figure 2:
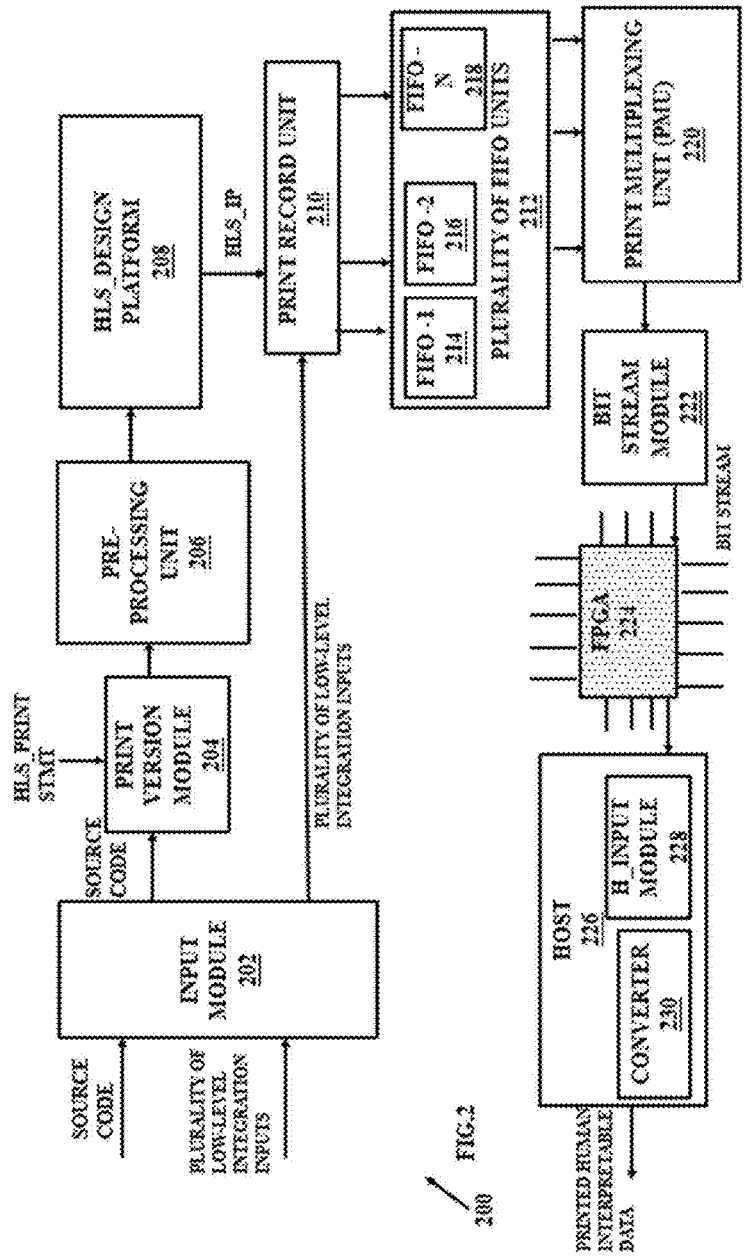
FIG. 2 is a functional block diagram to enable print functionality in high-level synthesis (HLS) design platforms according to some embodiments of the present disclosure.

FIG. 2 is a functional block diagram 200 of the system of FIG. 1, in accordance with some embodiments of the present disclosure. As depicted in the architecture, the FIG. 2 illustrates the functions of the components of the system 100 that includes for method and system to enable print functionality in high-level synthesis (HLS) design platforms.

The system 200 for method and system to enable print functionality in high-level synthesis (HLS) design platforms is configured for receiving a source code, via an Input module 202, receiving a source code and a plurality of low level integration inputs at a High-Level Synthesis (HLS) design platform.

The source code is associated with an IT application at a High-Level Synthesis (HLS) platform, wherein the source code comprises at least a print statement. The print statement comprises of a set of print variables to be printed. Further the source code is associated with a source code operation frequency. The IT application associated with the source code utilizes a Field Programmable Gate Array (FPGA) as a processing platform that is associated with a peripheral component interconnect express (PCIe) bandwidth threshold limit. In an example scenario, the IT application can be a data center application for monitoring software applications in the data center. The data center application would log important data happening including the run time contextual data, intermediate steps and final results—depending on the level of logging in force. The logged information that is printed serves many purposes like auditing, data for machine learning or just troubleshooting application execution issues.

The plurality of low level integration inputs at the HLS platform, via the input module 202, is associated with the FPGA. The low level integration inputs comprise a cycle counter, an application counter and a stream ID generator.

In an embodiment, the system 200 further comprises of a print version module 204 configured for updating the source code. The source code is updated to obtain a print version of the source code by including a set of HLS print statements.

In an embodiment, the system 200 further comprises of a pre-processing unit 206 is configured for pre-processing the print version of the source code to obtain a synthesizable source code using a source-to-source transformations based on a code generation script.

In an embodiment, the system 200 further comprises of an HLS_design platform 208 is configured for synthesizing the synthesizable source code to obtain an HLS_IP (HLS_Intellectual Property) based on the source code operation frequency.

In an embodiment, the system 200 further comprises of a print record unit 210. configured for determining if the HLS_IP is within the PCIe bandwidth threshold limit. Based on determining, a plurality of print records is created in a print record unit 210 using the plurality of low level integration input, wherein a print record is created for every print variable from the set of print variables.

In an embodiment, the system 200 further comprises a plurality of FIFO (First In First Out) units 212 that comprises of several individual FIFO units—FIFO-1 214, FIFO-2 216 and FIFO-N 218. The plurality of FIFO units 212 are configured to connect with the plurality of print records, wherein each print record from the plurality of print records is connected to a FIFO unit from amongst the plurality of First in First out (FIFO) units 212.

In an embodiment, the system 200 further comprises a print multiplexing unit (PMU) 220 configured for combining the plurality of print records to obtain a valid sequential print record. The combining includes scanning the plurality of print records using a stream combining scheme based on round robin technique.

In an embodiment, the system 200 further comprises a bit stream module 222 configured for synthesizing a Hardware Development Language (HDL) design using the HLS_IP, the plurality of print records and the valid sequential print record. The bit stream module 222 further creates an executable bitstream of the HDL design.

In an embodiment, the system 200 further comprises a FPGA 224. The executable bitstream are shared with the FPGA for processing. The FPGA 224 is pre-configured to perform/process the valid sequential print records as requirement by the IT application.

In an embodiment, the system 200 further comprises a host 226. The host 226 further comprises a H_Input module 228 and a converter 230. The H_Input module 228 receiving the processed sequential print records from the FPGA over a PCIe at a host, wherein the processed sequential print records is in a binary format. The converter 230 is configured to converting the processed sequential print records to a human interpretable data in the host using a formatter technique and printing the human interpretable data.

The various modules of the system 100 for method and system to enable print functionality in high-level synthesis (HLS) design platforms are implemented as at least one of a logically self-contained part of a software program, a self-contained hardware component, and/or, a self-contained hardware component with a logically self-contained part of a software program embedded into each of the hardware component that when executed perform the above method described herein.

Figure 3A:
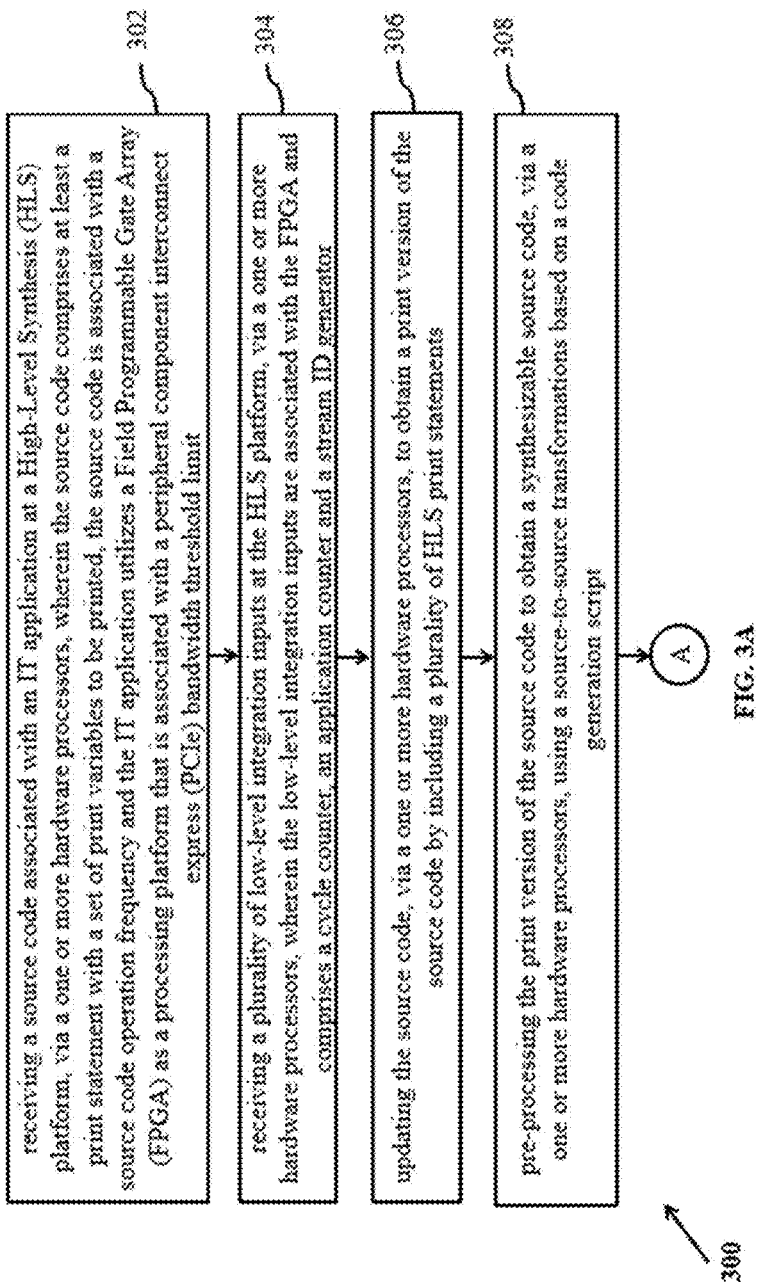
FIG. 3A, FIG. 3B and FIG. 3C is a flow diagram illustrating a method for to enable print functionality in high-level synthesis (HLS) design platforms in accordance with some embodiments of the present disclosure.
Figure 3B:
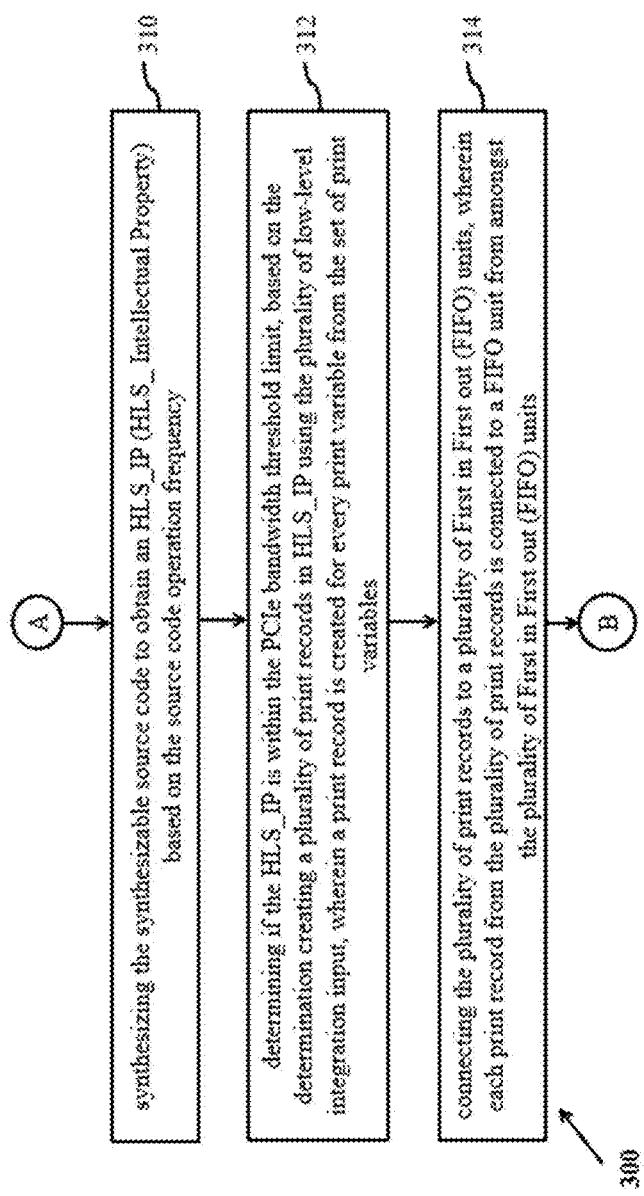
Figure 3C:
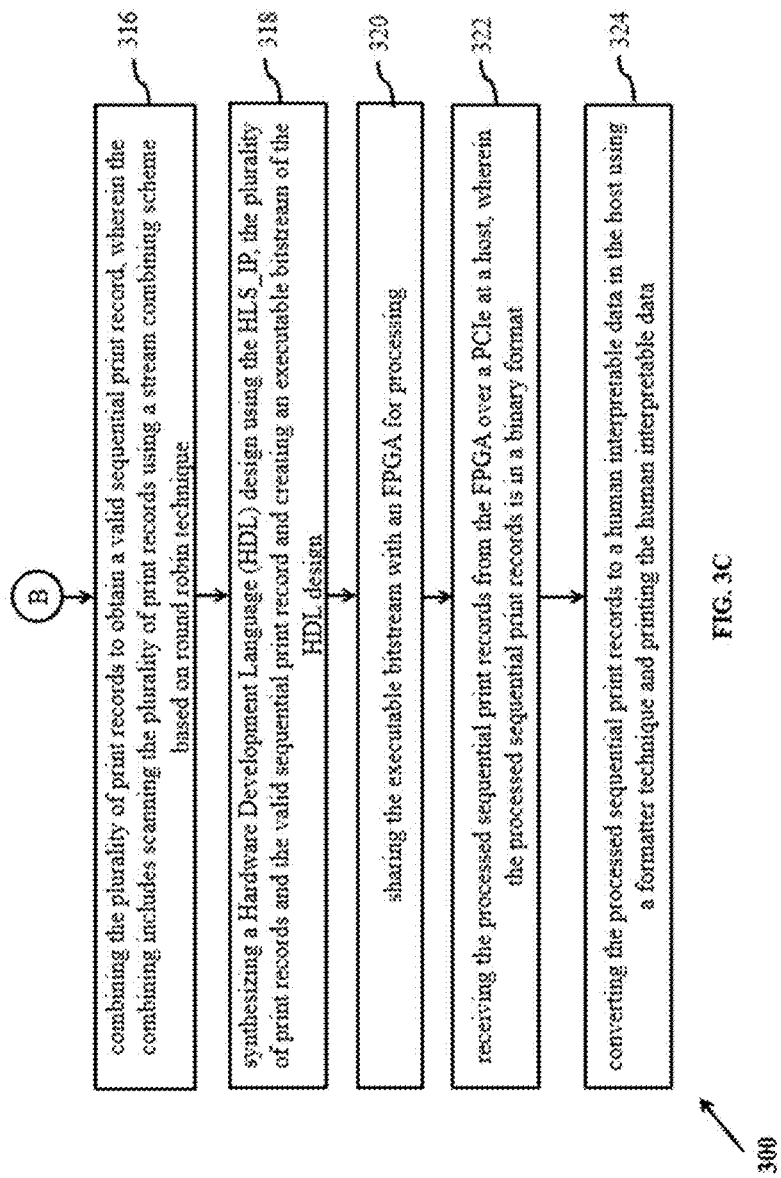

Functions of the components of the system 100 are explained in conjunction with functional modules of the system 100 stored in the memory 102 and further explained in conjunction with flow diagram of FIGS. 3A, 3B and 3C. The FIGS. 3A 3B and 3C, with reference to FIG. 1, is an exemplary flow diagram illustrating a method 300 for using the system 100 of FIG. 1 according to an embodiment of the present disclosure.

The steps of the method of the present disclosure will now be explained with reference to the components for method and system to enable print functionality in high-level synthesis (HLS) design platforms (100) and the modules (202- 230) as depicted in FIG. 2 and the flow diagrams as depicted in FIGS. 3A, 3B and 3C. Although process steps, method steps, techniques or the like may be described in a sequential order, such processes, methods and techniques may be configured to work in alternate orders. In other words, any sequence or order of steps that may be described does not necessarily indicate a requirement that the steps to be performed in that order. The steps of processes described herein may be performed in any order practical. Further, some steps may be performed simultaneously.

At step 302 of the method (300), a source code is received at a High-Level Synthesis (HLS) platform, via the Input module 202. The source code is associated with an IT application and comprises at least a print statement.

In an embodiment, the source code is associated with an IT application at a High-Level Synthesis (HLS) platform, wherein the source code comprises at least a print statement. The print statement comprises of a set of print variables to be printed. Further the source code is associated with a source code operation frequency. The IT application associated with the source code utilizes a Field Programmable Gate Array (FPGA) as a processing platform that is associated with a peripheral component interconnect express (PCIe) bandwidth threshold limit. In an example scenario, the IT application can be a data center application for monitoring software applications in the data center. The data center application would log important data happening including the run time contextual data, intermediate steps and final results—depending on the level of logging in force. The logged information that is printed serves many purposes like auditing, data for machine learning or just troubleshooting application execution issues. The FIG. 4A illustrates a sample source code, wherein the illustrated source code is a part of a larger code. The source code of FIG. 4A comprises of set of print variables to be printed as represented by the printf statements.

At the next step 304 of the method (300), a plurality of low level integration inputs is received at the HLS platform, via the Input module 202. The low level integration inputs are associated with the FPGA that is used as a processing platform for the IT application. The low level integration inputs comprise a cycle counter, an application counter and a stream ID generator.

In an embodiment the cycle counter also referred to as a clock cycle counter counts clock cycles associated with a system starting from the systems reset, wherein the value of the cycle counter indicates the time stamp of writing the print record to a FIFO. Further the application counter also referred to as a function invocation (or call) number (APPCN) is implemented as a hardware counter which is incremented once for every function call. The stream ID generator is a unique stream_id is assigned to every print variable for correlating the HLS_PRINT statement with print data in a receiver software.

The next step 306 of the method (300) includes a updating the source code to obtain a print version of the source code in the print version module 206. The source code is updated to obtain a print version of the source code by including a set of HLS print statements.

In an embodiment, the set of HLS print statements are complier directives which comprises of a name (-var), a type (-typ) and a comment (com) of each print variable from the set of print variables. An example scenario for source code and a corresponding print version of the source code is illustrated in FIG. 4A and FIG. 4B respectively. In the example of FIG. 4A and FIG. 4B, the printf statements are updated/replaced by the set of HLS print statements, wherein the name (-var), a type (-typ) and a comment (com) of each print variable have been updated at the printf statements.

The next step 308 of the method (300) includes pre-processing the print version of the source code to obtain a synthesizable source code, via the pre-processing unit 206. The print version of the source code is pre-processed to obtain a synthesizable source code using a source-to-source transformations based on a code generation script.

Figure 5:
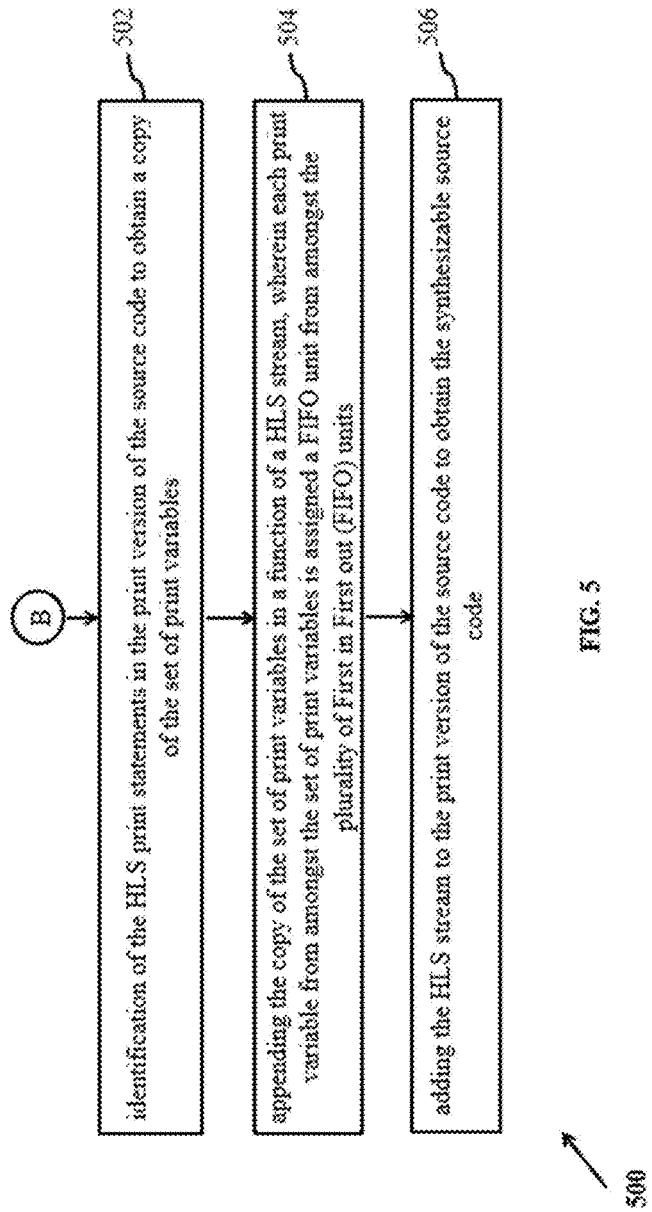
FIG. 5 is a flow diagram illustrating a method for source-to-source transformations based on a code generation script for enabling print functionality in HLS design platform in accordance with some embodiments of the present disclosure.

In an embodiment, the source-to-source transformations based on a code generation script is further explained in conjunction with flow diagram of FIG. 5 illustrating a method 500 for using the system 200 of FIG. 2 according to an embodiment of the present disclosure.

At step 502 of the method (500), the HLS print statements in the print version of the source code is identified. The identified HLS print statements is used to obtain a copy of the set of print variables.

In an embodiment, a parser based—keyword search technique is utilized to identify the HLS print statements, wherein keyword indicates the presence of a print statement and print variable The next step 504 of the method (500) includes appending the copy of the set of print variables in a function to a HLS stream. The appending process comprises of assigning each print variable from amongst the set of print variables to a HLS stream variable within the HLS stream. Every print variable in the function is written to a separate HLS Stream variable, because of separate interfaces for every print variable, multiple stream variables can be updated without contention and no latency overhead is encountered.

The next step 506 of the method (500) includes adding the HLS stream to the print version of the source code to obtain the synthesizable source code. Considering an example scenario, the synthesizable source code for a print version is shown in FIG. 4B and FIG. 4C Referring back to FIG. 3B, in the step 310 of the method (300) includes synthesizing the synthesizable source code to obtain an HLS_IP (HLS_Intellectual Property) in the HLS_design platform 208. The HLS_IP is obtained based on the source code operation frequency.

Figure 6:
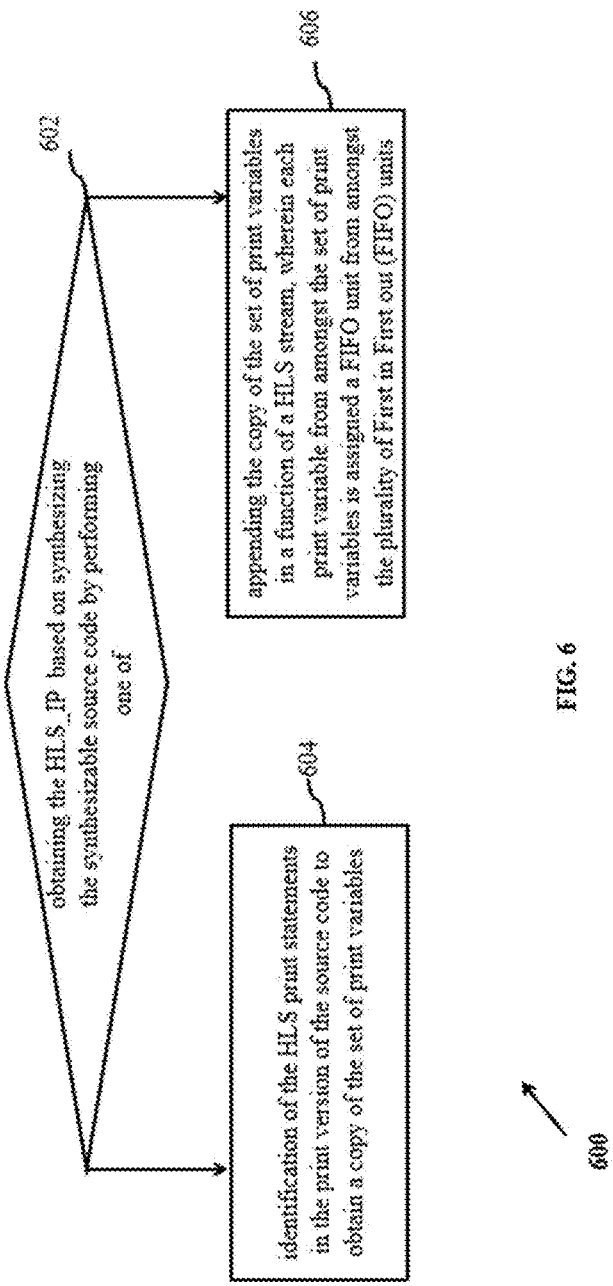
FIG. 6 is a flow diagram illustrating a method for obtaining the HLS_IP based on synthesizing the synthesizable source code for enabling print functionality in HLS design platform in accordance with some embodiments of the present disclosure.

In an embodiment, process of obtaining the HLS_IP based on synthesizing the synthesizable source code is further explained in conjunction with flow diagram of FIG. 6 illustrating a method 600 for using the system 200 of FIG. 2 according to an embodiment of the present disclosure. The synthesizable source code is synthesized, and a frequency of the synthesizable source code is compared with the source code operation frequency to obtain the HLS_IP (602) as explained in FIG. 6 by performing one of:

In an embodiment, at step 604 of the method (600), on synthesizing the synthesizable source code at the source code operation frequency, then the synthesizable source code is retained as the HLS_IP (HLS_Intellectual Property).

In another embodiment, at step 606 of the method (600), when unable to synthesizing the synthesizable source code at the source code operation frequency, then the frequency associated with the synthesizable source code is tuned based on a heuristic frequency optimization technique to match the operation frequency to obtain the HLS_IP. In an example scenario, the heuristic frequency optimization technique used to match the operation frequency includes incrementally reducing the synthesis frequency to obtain timing closure.

Referring back to FIG. 3B, in the next step 312 of the method (300) includes determining if the HLS_IP is within the PCIe bandwidth threshold limit in the print record unit 210. Further based on the determination of whether the HLS_IP is within the PCIe bandwidth threshold limit, a plurality of print records is created in HLS_IP. The plurality of print records is created using the plurality of low level integration input, wherein a print record is created for every print variable from the set of print variables. Further on determination of the HLS_IP outside the PCIe bandwidth threshold limit print record, displaying a "termination" message indicative of disabled print functionality in the High-Level Synthesis (HLS) platforms In an embodiment, the termination message behaves as an alert message to a user, wherein the user is alerted of a possible performance slowdown due to print support.

At the next step 314 of the method (300), the plurality of print records is connected to a plurality of First in First out (FIFO) units 212. Each print record from the plurality of print records is connected to a FIFO unit from amongst the plurality of First in First out (FIFO) units 212.

In an embodiment, a separate FIFO is assigned to each print variable to enable storage of the print records separately. Further because of separate interfaces for every print variable, multiple stream variables can be updated/stored without contention and no latency overhead is encountered.

At the next step 316 of the method (300) the plurality of print records is combined to obtain a valid sequential print record in the print multiplexing unit (PMU) 220. The combining includes scanning the plurality of print records using a stream combining scheme based on round robin technique.

Figure 7:
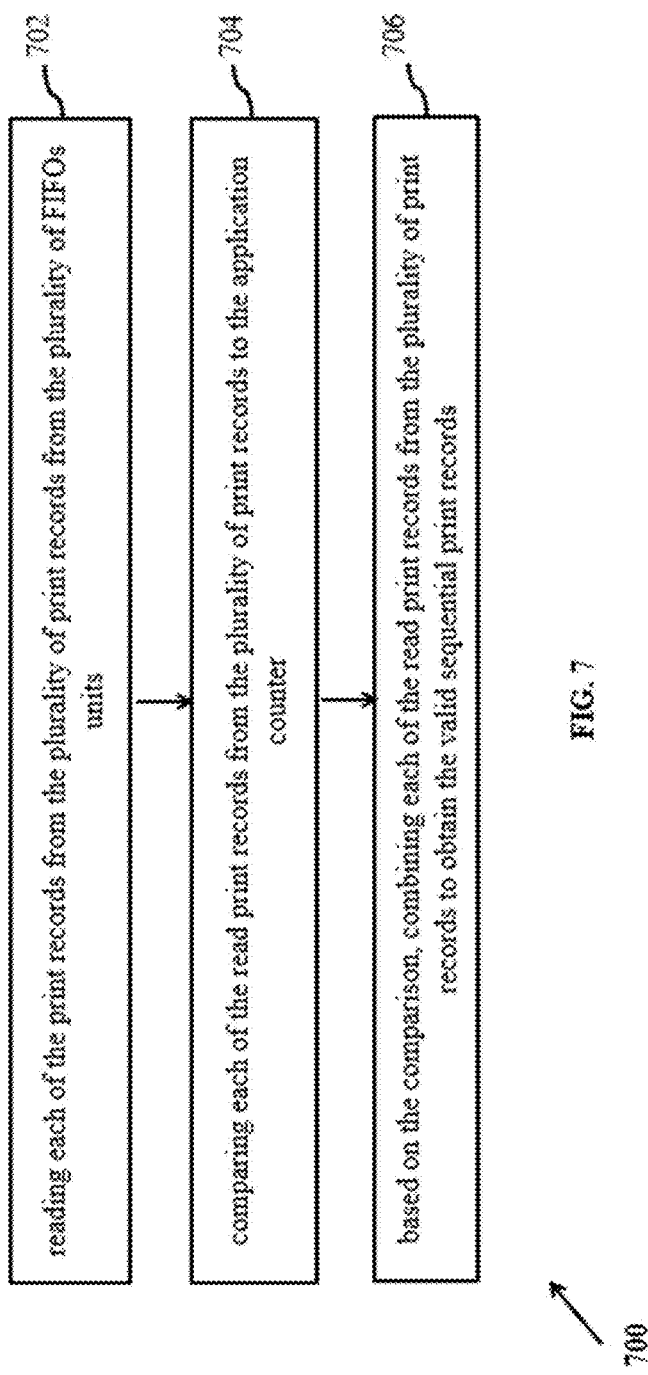
FIG. 7 is a flow diagram illustrating a method for stream combining scheme based on round robin technique for enabling print functionality in HLS design platform in accordance with some embodiments of the present disclosure.

In an embodiment, the stream combining scheme based on round robin technique is further explained in conjunction with flow diagram of FIG. 7 illustrating a method 700 for using the system 200 of FIG. 2 according to an embodiment of the present disclosure.

At step 702 of the method (700) each of the print records is read from the plurality of print records from the plurality of FIFOs units 212.

In an embodiment, the print records are read from the plurality of FIFOs based on the application counter. In an example scenario, considering 'n' as print variable, APPCNT as the application counter and $FIFO_j$ as a print variable j. The step of reading from FIFO can be expressed as shown below:

```
Initialize record with print record and APPCNT to 1
  while forever do
  for j in n do
while record in FIFOj do
    record.read();
end while
```

At the next step 704 of the method (700) each of the read print records is compared from the plurality of print records to the application counter (APPCNT).

At the next step 706 of the method (700), based on the comparison, combining each of the read print records from the plurality of print records to obtain the valid sequential print records.

```
if record.APPCN == APPCNT then
  Dequeue record;
  Enqueue to XDMA_IP
else
  Break
end if
```

Referring back to FIG. 3C, in the next step 318 of the method (300) includes synthesizing a Hardware Development Language (HDL) design in the bit stream module 222. The HDL design is synthesized using the HLS_IP, the plurality of print records and the valid sequential print record. Further the HDL design is used to create an executable bitstream of the HDL design.

In an embodiment, the executable bitstream generation process comprises the synthesis and implementation of HDL design which expresses the HDL design in terms of FPGA components and primitives. Hence the HDL design is expressed as a combination of HLS_design platform 208, plurality of First in First out (FIFO) units 212 and the print multiplexing unit (PMU).

The next step 318 of the method (300) includes sharing the executable bitstream with the FPGA 224 for processing.

In an embodiment, the executable bitstream are shared with the FPGA 224 for processing. The FPGA is pre-configured to perform/process the valid sequential print records as requirement by the IT application.

At the step 320, the method (300) includes receiving the processed sequential print records from the FPGA over a PCIe at the H_Input module 228 in the host 226. The processed sequential print records are in a binary format.

At step 322 of the method (300) converting the processed sequential print records to a human interpretable data in the converter 230 of the host 226 using a formatter technique.

In an embodiment, the formatter technique comprises of sorting the processed sequential print records using a sorting technique based on the application counter and the cycle counter. The formatter technique is implemented in several steps that include reading the processed sequential print records, comparing the application counter of the processed sequential print records with a pre-defined application counter, based on the comparison copying the processed sequential print records into a new record and finally sorting the new record to obtain the human interpretable data.

After converting the processed sequential print records to a human interpretable data, the human interpretable data is printed.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

Experimental Results

Figure 8:
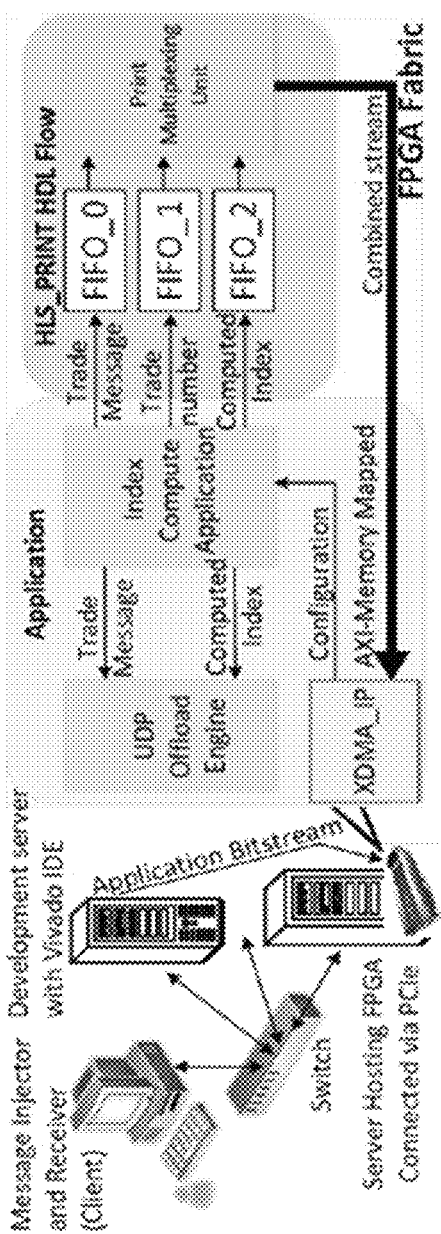
FIG. 8 illustrates a use case example to enable print functionality in high-level synthesis (HLS) design platforms while performing index computation in a stock exchange in accordance with some embodiments of the present disclosure.

An experiment has been conducted for stock exchange index computation, where expected response time of these IT application (Stock Exchange) is in μsec range. The stock exchange index computation is an industrial application that operates in client-server based architecture as shown in FIG. 8.

The source code (trade message in this scenario) is received and processed by extracting trade parameters. The index compute algorithm is executed on the FPGA and the updated index is sent back, wherein the index compute algorithm to the FPGA using HLS to function as a server application. The incoming trade messages contain various information such as token number, trade volume, trade price, type of trade etc. which identifies the traded stock. For the purpose of documentation/analysis, it is necessary to log (print) the incoming trade messages, the computed index and the number of trades processed. In this experiment incoming trade message is printed (structure, 48 bytes), the number of processed trades (int) and index value (float) in IC using proposed method and system to enable print functionality in high-level synthesis (HLS) design platforms, and analyzes the additional resource usage on FPGA as a result compared to the implementation without HLS_PRINT. The IC IP is synthesized at 156.25 MHz in HLS and integrated with low-level IPs. The performance (latency) counter accounts for cycles between receiving trade message and sending computed index back to UDP offload engine. The latency of original and HLS_PRINT supported index compute remains unchanged at 518.4 ns. Hence based on the experimental results it was concluded that the printed incoming trade message, the number of processed trades and the index value were successfully received at the host and were found to be functionally correct with negligible latency.

method and system to enable print functionality in high-level synthesis (HLS) design platforms method and system to enable print functionality in high-level synthesis (HLS) design platforms Further experiments have been conducted for to analyze the disclosed method and system to enable print functionality in high-level synthesis (HLS) design platforms with existing state of art techniques based on two categories—

(a) Methods to transfer data between FPGA and host
(b) Methods enabling print in HLS design platforms.

The comparison of disclosed method and system to enable print functionality in high-level synthesis (HLS) design platforms with the related existing state of art is shown in Table 1. The table 1 compares the existing state of art techniques against multiple features including point of action (when the source code is modified through the process), online logging, low level integration and readable logs. The table.1 is shown below:

TABLE 1

Comparison of the disclosed technique with the state of art.

|  | Point of action | Online Logging | Low Level Integration | Readable Logs |
| --- | --- | --- | --- | --- |
| Technique 1 | Intermediate representation | No | No | No |
| Technique 2 | abstract syntax tree representation | No | No | No |
| Technique 3 | Hardware design representation | Yes | Manual | No |
| Disclosed Technique | Source-to-source transformation | Yes | Auto | Yes |

Based on the above table.1, it can be analyzed-concluded that state-of-the-art Technique 1 (referred to as technique 1 in table 1) uses trace buffer optimizations to capture signals for long time. The State-of-the-art Technique 1 uses the intermediate representation (IR) of design to extract information required to introduce the debug circuitry in HDL. Thus, limiting the use to open-source HLS compilers only. Whereas the disclosed technique employs source-to-source transformation and functions at a pre-compile level. The disclosed technique feature makes the system usable with open/closed source compilers. Further the State-of-the-art Technique 2 (referred to as technique 2 in table 1) adopts source-to-source transformation to monitor debug signals. However, requires the user has to be familiar with abstract syntax tree representation of a program. The disclosed technique does not require the user to be familiar with compiler-level details and thus is easier to use. Further with respect to the state-of-the-art Technique 3, this uses trace buffers to capture the print data and requires manual integration with the print signals. The disclosed technique provides an automated means to enable printing for variables. Hence based on the above points/table. 1, it can be seen that the feature of readable logs is exclusive to only the disclosed technique.

This disclosure generally relates to method and system to enable print functionality in high-level synthesis (HLS) design platforms. The recent availability FPGA-HLS is a great success due to availability of compilers for FPGAs as opposed to hardware description languages (HDLs) that requires special skills. However, the compilers within the HLS design platform includes limited support for all the standard libraries, wherein features like print functionality is not supported. The invention discloses techniques to enable print functionality in HLS design platforms based on source-to-source transformations and stream combining scheme. In addition to enabling print functionality, the invention also discloses a formatter technique to receive-format FPGA data into human interpretable data.

It is to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g. hardware means like e.g. an application-specific integrated circuit (ASIC), a field-programmable gate array (FPGA), or a combination of hardware and software means, e.g. an ASIC and an FPGA, or at least one microprocessor and at least one memory with software processing components located therein. Thus, the means can include both hardware means and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to, firmware, resident software, microcode, etc. The functions performed by various components described herein may be implemented in other components or combinations of other components. For the purposes of this description, a computer-usable or computer readable medium can be any apparatus that can comprise, store, communicate, propagate, or transport the program for use by or in connection with the instruction execution system, apparatus, or device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated by the following claims.

What is claimed is:

1. A processor-implemented method comprising:
receiving a source code associated with an IT application at a High-Level Synthesis (HLS) platform, via a one or more hardware processors, wherein the source code comprises at least a print statement with a set of print variables to be printed, the source code is associated with a source code operation frequency and the IT application utilizes a Field Programmable Gate Array (FPGA) as a processing platform that is associated with a peripheral component interconnect express (PCIe) bandwidth threshold limit;
receiving a plurality of low level integration inputs at the HLS platform, via the one or more hardware processors, wherein the low level integration inputs are associated with the FPGA and comprises a cycle counter, an application counter and a stream ID generator;
updating the source code, via the one or more hardware processors, to obtain a print version of the source code by including a set of HLS print statements;
pre-processing the print version of the source code to obtain a synthesizable source code, via the one or more hardware processors, using a source-to-source transformations based on a code generation script;
synthesizing the synthesizable source code to obtain an HLS_IP (HLS_Intellectual Property), via the one or more hardware processors, based on the source code operation frequency;
determining if the HLS_IP is within the PCIe bandwidth threshold limit, via the one or more hardware processors, based on the determination creating a plurality of print records in HLS_IP using the plurality of low level integration input, wherein a print record is created for every print variable from the set of print variables;

connecting the plurality of print records to a plurality of First in First out (FIFO) units, via the one or more hardware processors, wherein each print record from the plurality of print records is connected to a FIFO unit from amongst the plurality of First in First out (FIFO) units;

combining the plurality of print records to obtain a valid sequential print record, via the one or more hardware processors, wherein the combining includes scanning the plurality of print records using a stream combining scheme based on round robin technique;

synthesizing a Hardware Development Language (HDL) design using the HLS_IP, via the one or more hardware processors, the plurality of print records and the valid sequential print record and creating an executable bitstream of the HDL design;

sharing the executable bitstream with an FPGA, via the one or more hardware processors, for processing;

receiving the processed sequential print records from the FPGA over a PCIe at a host, wherein the processed sequential print records is in a binary format; and converting the processed sequential print records to a human interpretable data in the host, via the one or more hardware processors, using a formatter technique and printing the human interpretable data.

2. The method of claim 1, wherein the set of HLS print statements are complier directives which comprises of a name (-var), a type (-typ) and a comment (-com) of each print variable from the set of print variables.

3. The method of claim 1, wherein the source-to-source transformations based on a code generation script comprises:

identification of the HLS print statements in the print version of the source code to obtain a copy of the set of print variables;

appending the copy of the set of print variables in a function of a HLS stream, wherein each print variable from amongst the set of print variables is assigned a HLS steam variable of the HLS stream; and adding the HLS stream to the print version of the source code to obtain the synthesizable source code.

4. The method of claim 1, wherein obtaining the HLS_IP based on synthesizing the synthesizable source code by performing one of:

retaining the synthesizable source code as the HLS_IP (HLS_Intellectual Property) on synthesizing the synthesizable source code at the source code operation frequency; or tuning a frequency associated with the synthesizable source code based on a heuristic frequency optimization technique to match the operation frequency to obtain the HLS_IP, when unable to synthesizing the synthesizable source code at the source code operation frequency.

5. The method of claim 1, wherein on determination of the HLS_IP outside the PCIe bandwidth threshold limit print record, displaying a "termination" message indicative of disabled print functionality in the High-Level Synthesis (HLS) platforms.

6. The method of claim 1, wherein the stream combining scheme based on round robin manner technique comprises:

reading each of the print records from the plurality of print records from the plurality of FIFOs units;

comparing each of the read print records from the plurality of print records to the application counter; and based on the comparison, combining each of the read print records from the plurality of print records to obtain the valid sequential print records.

7. The method of claim 1, wherein the formatter technique comprises of sorting the processed sequential print records using a sorting technique based on the application counter and the cycle counter.

8. A system comprising:

an input/output interface;

one or more memories; and one or more hardware processors, the one or more memories coupled to the one or more hardware processors, wherein the one or more hardware processors are configured to execute programmed instructions stored in the one or more memories, to:

receive a source code associated with an IT application at a High-Level Synthesis (HLS) platform, via the one or more hardware processors, wherein the source code comprises at least a print statement with a set of print variables to be printed, the source code is associated with a source code operation frequency and the IT application utilizes a Field Programmable Gate Array (FPGA) as a processing platform that is associated with a peripheral component interconnect express (PCIe) bandwidth threshold limit;

receive a plurality of low level integration inputs at the HLS platform, via the one or more hardware processors, wherein the low level integration inputs are associated with the FPGA and comprises a cycle counter, an application counter and a stream ID generator;

update the source code, via the one or more hardware processors, to obtain a print version of the source code by including a plurality of HLS print statements;

pre-process the print version of the source code to obtain a synthesizable source code, via the one or more hardware processors, using a source-to-source transformations based on a code generation script;

synthesize the synthesizable source code to obtain an HLS_IP (HLS_Intellectual Property), via the one or more hardware processors, based on the source code operation frequency;

determine if the HLS_IP is within the PCIe bandwidth threshold limit, via the one or more hardware processors, based on the determination creating a plurality of print records in HLS_IP using the plurality of low level integration input, wherein a print record is created for every print variable from the set of print variables;

connect the plurality of print records to a plurality of First in First out (FIFO) units, via the one or more hardware processors, wherein each print record from the plurality of print records is connected to a FIFO unit amongst the plurality of FIFO units;

combine the plurality of print records to obtain a valid sequential print record, via the one or more hardware processors, wherein the combining includes scanning the plurality of print records using a stream combining scheme based on round robin technique;

synthesize a Hardware Development Language (HDL) design using the HLS_IP, via the one or more hardware processors, the plurality of print records and the valid sequential print record and creating an executable bitstream of the HDL design;

share the executable bitstream with an FPGA, via the one or more hardware processors, for processing;

receive the processed sequential print records from the FPGA over a PCIe at a host, via the one or more hardware processors, wherein the processed sequential print records is in a binary format; and convert the processed sequential print records to a human interpretable data, via the one or more hardware processors, in the host using a formatter technique and printing the human interpretable data.

9. The system of claim 8, wherein the one or more hardware processors are configured by the instructions to perform the source-to-source transformations based on a code generation script comprises:
  identification of the HLS print statements in the print version of the source code to obtain a copy of the set of print variables;
  appending the copy of the set of print variables in a function of a HLS stream, wherein each print variable from amongst the set of print variables is assigned a HLS steam variable of the HLS stream; and
  adding the HLS stream to the print version of the source code to obtain the synthesizable source code.

10. The system of claim 8, wherein the one or more hardware processors are configured by the instructions to obtain the HLS_IP based on synthesizing the synthesizable source code by performing one of:
  retaining the synthesizable source code as the HLS_IP (HLS_Intellectual Property) on synthesizing the synthesizable source code at the source code operation frequency; or
  tuning a frequency associated with the synthesizable source code based on a heuristic frequency optimization technique to match the operation frequency to obtain the HLS_IP, when unable to synthesizing the synthesizable source code at the source code operation frequency.

11. The system of claim 8, wherein the one or more hardware processors are configured by the instructions to perform the stream combining scheme based on round robin manner technique comprises:
  reading each of the print records from the plurality of print records from the plurality of FIFOs units;
  comparing each of the read print records from the plurality of print records to the application counter; and
  based on the comparison, combining each of the read print records from the plurality of print records to obtain the valid sequential print records.

12. The system of claim 8, wherein the one or more hardware processors are configured by the instructions to perform the formatter technique comprises of sorting the processed sequential print records using a sorting technique based on the application counter and the cycle counter.

13. A computer program product comprising a non-transitory computer readable medium having a computer readable program embodied therein, wherein the computer readable program, when executed on a computing device, causes the computing device to
  receive a source code associated with an IT application at a High-Level Synthesis (HLS) platform, via the one or more hardware processors, wherein the source code comprises at least a print statement with a set of print variables to be printed, the source code is associated with a source code operation frequency and the IT application utilizes a Field Programmable Gate Array (FPGA) as a processing platform that is associated with a peripheral component interconnect express (PCIe) bandwidth threshold limit;
  receive a plurality of low level integration inputs at the HLS platform, via the one or more hardware processors, wherein the low level integration inputs are associated with the FPGA and comprises a cycle counter, an application counter and a stream ID generator;
  update the source code, via the one or more hardware processors, to obtain a print version of the source code by including a plurality of HLS print statements;
  pre-process the print version of the source code to obtain a synthesizable source code, via the one or more hardware processors, using a source-to-source transformations based on a code generation script;
  synthesize the synthesizable source code to obtain an HLS_IP (HLS_Intellectual Property), via the one or more hardware processors, based on the source code operation frequency;
  determine if the HLS_IP is within the PCIe bandwidth threshold limit, via the one or more hardware processors, based on the determination creating a plurality of print records in HLS_IP using the plurality of low level integration input, wherein a print record is created for every print variable from the set of print variables;
  connect the plurality of print records to a plurality of First in First out (FIFO) units, via the one or more hardware processors, wherein each print record from the plurality of print records is connected to a FIFO unit amongst the plurality of FIFO units;
  combine the plurality of print records to obtain a valid sequential print record, via the one or more hardware processors, wherein the combining includes scanning the plurality of print records using a stream combining scheme based on round robin technique;
  synthesize a Hardware Development Language (HDL) design using the HLS_IP, via the one or more hardware processors, the plurality of print records and the valid sequential print record and creating an executable bitstream of the HDL design;
  share the executable bitstream with an FPGA, via the one or more hardware processors, for processing;
  receive the processed sequential print records from the FPGA over a PCIe at a host, via the one or more hardware processors, wherein the processed sequential print records is in a binary format; and
  convert the processed sequential print records to a human interpretable data, via the one or more hardware processors, in the host using a formatter technique and printing the human interpretable data.

* * * * *